United States Patent
You et al.

(10) Patent No.: US 10,044,184 B1
(45) Date of Patent: Aug. 7, 2018

(54) MONITORING AND SHUTDOWN DEVICE FOR A SOLAR PHOTOVOLTAIC MODULE

(71) Applicant: JIANGSU ENMAGIC ENERGY CO., LTD., Wuxi (CN)

(72) Inventors: Li-Wei You, Wuxi (CN); Jian-Bin Tong, Wuxi (CN)

(73) Assignee: Jiangsu Enmagic Energy Co., Ltd., Jiangsu (CN)

( * ) Notice: Subject to any disclaimer, the term of this patent is extended or adjusted under 35 U.S.C. 154(b) by 0 days.

(21) Appl. No.: 15/837,179

(22) Filed: Dec. 11, 2017

(30) Foreign Application Priority Data

Oct. 26, 2017 (CN) .................... 2017 2 1388233 U

(51) Int. Cl.
| | | |
|---|---|---|
| *H02J 3/38* | (2006.01) |
| *H02J 1/00* | (2006.01) |
| *H02S 50/10* | (2014.01) |
| *H02S 40/34* | (2014.01) |
| *H01L 31/02* | (2006.01) |
| *H02J 13/00* | (2006.01) |

(52) U.S. Cl.
CPC .......... *H02J 1/00* (2013.01); *H01L 31/02021* (2013.01); *H02J 3/383* (2013.01); *H02J 13/0079* (2013.01); *H02S 40/34* (2014.12); *H02S 50/10* (2014.12); *Y02E 10/566* (2013.01)

(58) Field of Classification Search
CPC .......... H02J 1/00; H02J 13/0079; H02J 3/383; H02S 50/10; H02S 40/34; H01L 31/02021; Y02E 10/566
See application file for complete search history.

(56) References Cited

U.S. PATENT DOCUMENTS

2010/0127570 A1* 5/2010 Hadar .................... H04B 3/548
307/77

* cited by examiner

*Primary Examiner* — Daniel Cavallari
(74) *Attorney, Agent, or Firm* — Rosenberg, Klein & Lee

(57) ABSTRACT

A monitoring and shutdown device for a solar photovoltaic (PV) module (20) has a control switch (11), a micro control unit (MCU) (10), a voltage acquisition unit (13), a temperature acquisition unit (14) and a power line communication (PLC) module (15). The control switch (11) connects to a power series circuit of the PV module. Output terminals of the voltage acquisition unit (13) and the temperature acquisition unit (14) connect to the MCU. The voltage acquisition unit (13) and the PLC module (20) connect to the power series circuit. The MCU (10) connects to the control switch (11), and determines whether over-voltage or over-temperature occurs to the PV module (20) by the voltage and temperature acquisition units (13, 14). For abnormal conditions, the MCU (10) sends a notification through the PLC module (15), and disconnects the PV module (20) from the power series circuit by the control switch (11).

10 Claims, 2 Drawing Sheets

MONITORING AND SHUTDOWN DEVICE FOR A SOLAR PHOTOVOLTAIC MODULE

BACKGROUND OF THE INVENTION

1. Field of the Invention

The invention relates to a monitoring and shutdown device and, in particular, to a monitoring and shutdown device for a solar photovoltaic (PV) module to perform real-time monitoring of the voltage and temperature of the solar PV module. The monitoring and shutdown device uses power line communication to send out monitoring information, and actively sends a command or receives a remote command to shut down the solar PV module.

2. Description of Related Art

As a power generation device, photovoltaic (PV) modules may be irregularly shielded by tree branches and buildings in the natural environment during practical use, causing the PV modules to generate heat. When the light intensity is too strong, the current or temperature may exceed the limit. If the photovoltaic (PV) modules are not shut down in time, the heat will produce hot spots and even lead to fire. Moreover, the output voltage of a single PV module is relatively low, but the total voltage of multiple PV modules that have been connected in series could be far beyond a safe voltage. Once a problem occurs, it is fatal, especially when the PV modules are on fire. As the voltage of the PV modules in series adds up, a fire protection system may not function well. In addition, there are still other problems in the safety measures of the PV modules:

1. At present, the monitoring is at the combiner box level, not the actual condition of each PV module.
2. When an abnormal condition occurs, one can only shut down all the PV modules connected in the series. The PV modules still have voltage output after being cut off, still causing potential risks.
3. Maintenance personnel need to go to the disordered site and manually cut off the circuit.
4. The control device of a monitoring product for the PV modules requires a separate power supply. In this case, the wiring costs higher.
5. After collecting related information parameters, the monitoring product must communicate with a monitoring end in a wired or wireless way. However, the wired communication requires additional wiring and costs higher. The wireless communication is restricted by the industrial scientific medical (ISM) band to its limited spectrum. At the same time, the wireless signal is easy to be interfered and has high bit error rate.

Since the PV modules have a high safety standard, such as UL and IEC, the voltage of the PV modules in series must be pulled to a safe value within a short time.

It is seen from the above that the existing monitoring technique of the PV modules still needs to be improved.

SUMMARY OF THE INVENTION

An objective of the invention is to provide a monitoring and shutdown device for a PV module. The monitoring and shutdown device performs real-time monitoring of the voltage and temperature of the solar PV module, uses power line communication to send out monitoring information, and, when the detected voltage or temperature is abnormal, actively sends a command or receives a remote command to shut down the PV module.

The disclosed monitoring and shutdown device for a PV module includes:
- a control switch;
- a micro control unit having a plurality of input/output (I/O) terminals;
- a driver module connected between one of the I/O terminals of the micro control unit and the control switch;
- a voltage acquisition unit having a set of input terminals and an output terminal connecting to one of the I/O terminals of the micro control unit;
- a temperature acquisition unit having a temperature output terminal connecting to one of the I/O terminals of the micro control unit; and
- a power line communication (PLC) module having a power line connection terminal and an information transmission terminal connected to one of the I/O terminals of the micro control unit.

The control switch, the voltage acquisition unit, and the PLC module are connected to the power series circuit of a PV. The control switch is normally in a connected state. The micro control unit uses the driver module to turn on and off the control switch. The voltage acquisition unit detects the output voltage of the connected PV module in real time, and sends the detected voltage information to the micro control unit. When the output voltage of the PV module is abnormal, the micro control unit uses the PLC module to communicate with a system terminal. Moreover, the micro control unit actively sends a command or follows a command output from the system terminal to control the driver module to shut down the PV module. Thus, a total voltage of the connected PV modules is pulled down to a safe value within a short time, ensuring the system safety.

Since the monitoring and shutdown device utilizes power line communication to communicate with the remote system terminal, there is no need to set up another wired or wireless network. This solves the problems of high cost of the wired communication and limited spectrum of the wireless network due to the ISM band.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

Figure 1:
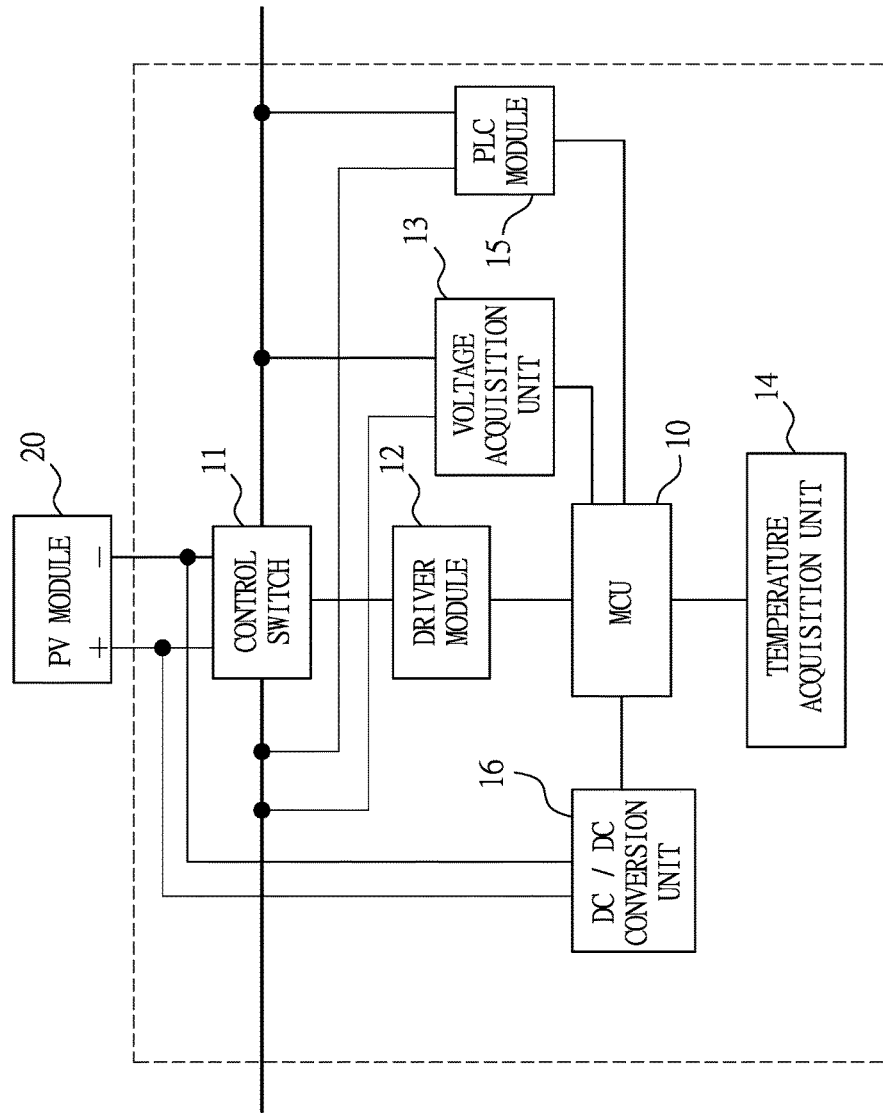
FIG. 1 is a block diagram of the invention.

With reference to FIG. 1, a monitoring and shutdown device is used with a PV module 20. The PV module 20 has a positive output terminal and a negative output terminal. When multiple PV modules 20 are connected via their positive and negative output terminals in series, a power series circuit is formed by the PV modules 20. The monitoring and shutdown device includes a micro control unit 10, a control switch 11, a driver module 12, a voltage acquisition unit 13, a temperature acquisition unit 14, and a power line communication (PLC) module 15.

The micro control unit 10 provides an operating function and has several I/O terminals connecting respectively to the driver module 12, the voltage acquisition unit 13, the temperature acquisition unit 14, and the PLC module 15. The micro control unit 10 can be implemented by a microcontroller of the STM or MCS-51 series.

The control switch 11 has a positive input terminal, a negative input terminal, a positive output terminal, a negative output terminal, and a controlled terminal. The positive and negative input terminals of the control switch 11 are connected to the positive and negative output terminals of the PV module 20. The positive and negative output terminals of the control switch 11 are connected to the power series circuit. Normally, the control switch 11 is conductive. That is, the PV module 20 is normally connected to the power series circuit. When the control switch 11 shuts off, the PV module 20 is disconnected from the power series circuit, or the power series circuit will be interrupted. In this embodiment, the on and off of the control switch 11 is controlled by the micro control unit 10 via the driver module 12. Therefore, the driver module 12 is connected between one of the I/O terminals of the micro control unit 10 and the controlled terminal of the control switch 11.

The voltage acquisition unit 13 has a set of input terminals and an output terminal. In this embodiment, the set of input terminals is connected to the PV module 20 to detect the output voltage of the PV module 20. The input terminals of the voltage acquisition unit 13 are connected to the positive and negative output terminals of the control switch 11 to detect the output voltage of the PV module 20 via the control switch 11. The output terminal of the voltage acquisition unit 13 connects to the micro control unit 10 to send the detected voltage to the micro control unit 10.

The temperature acquisition unit 14 is implemented by a temperature sensor with a temperature output terminal connecting to one of the I/O terminals of the micro control unit 10. The temperature acquisition unit 14 detects the temperature of the PV module 20, thereby monitoring high temperature possibly generated by serious hot spots of the PV module 20. The detected temperature is sent to the micro control unit 10.

The PLC module 15 is a power line communication device that has an information transmission terminal and power line connection terminals. The information transmission terminal connects to one of the I/O terminals of the micro control unit 10. The power line connection terminals connect to the power series circuit of the PV module 20. In this embodiment, the power line connection terminals of the PLC module 15 connect to the positive and negative output terminals of the control switch 11.

The working power of the monitoring and shutdown device comes from the connected PV modules 20. There is no need to provide a separate power supply system. In order to use the output power of the PV module 20 as the working power, the monitoring and shutdown device further includes a DC/DC conversion unit 16. The DC/DC conversion unit 16 has a set of module power connection terminals and a power output terminal. The set of module power connection terminals connects to the positive and negative power terminals of the PV module 20. The power output terminal connects to the micro control unit 10. Therefore, the DC/DC conversion unit 16 obtains its power from the PV module 20. After DC to DC voltage conversion and stabilization, stable DC working power is supplied to the micro control unit 10. Since no additional power supply is required, the device reliability becomes higher.

Figure 2:
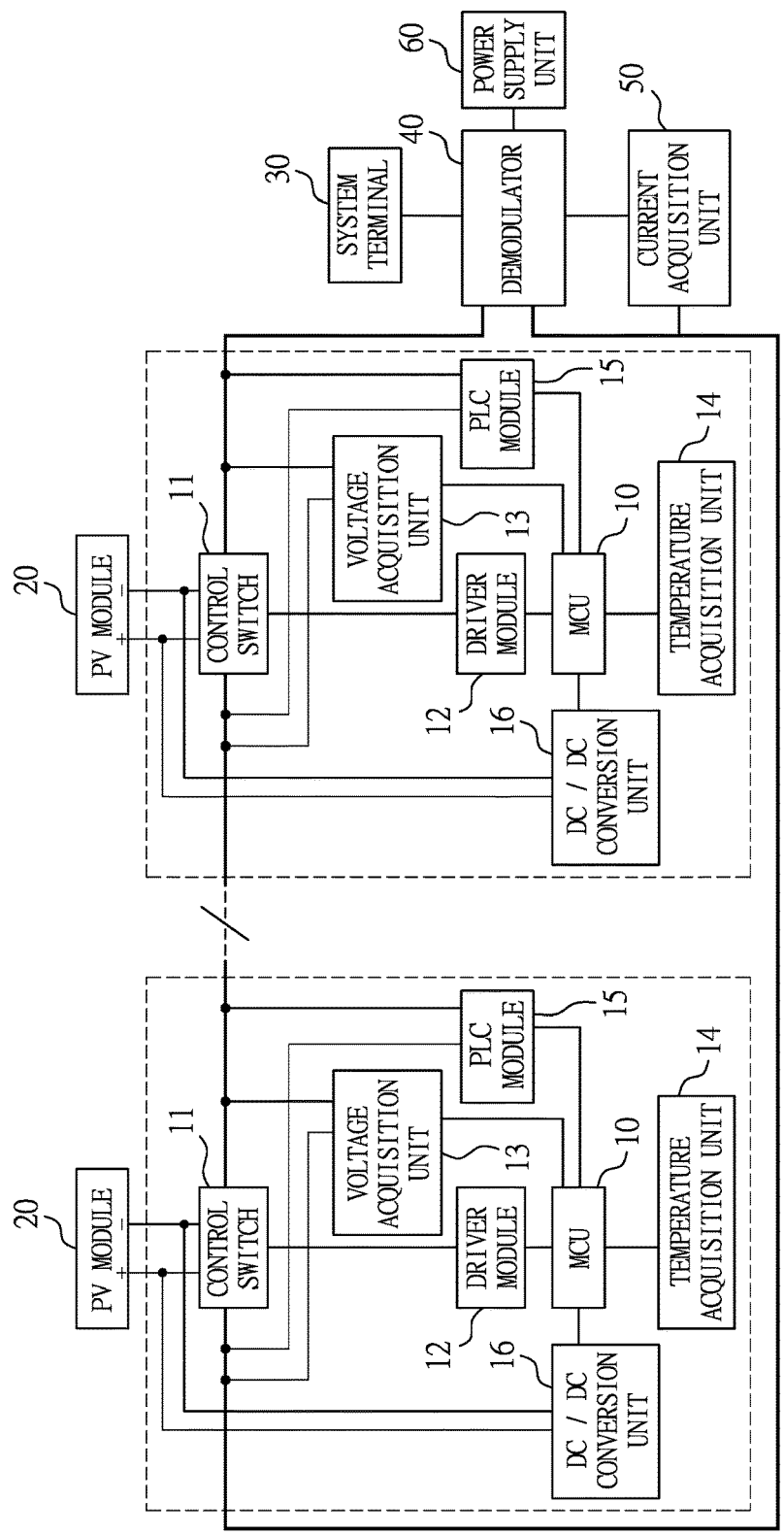
FIG. 2 is a system block diagram of the invention.

The explicit structure of an embodiment of the invention is described above. The application of the same is described below with reference to FIG. 2.

In a solar energy power supply system, multiple PV modules 20 are connected in series to form a power series circuit. Each of the PV modules 20 is connected with a monitoring and shutdown device. The monitoring and shutdown device of each of the PV modules 20 is connected to the power series circuit via the control switch 11 and the PLC module 15. When the voltage or temperature of the PV module 20 becomes abnormal, the control switch 11 makes the PV module 20 disconnect from the power series circuit, or interrupts the power series circuit. The PLC module 15 uses power line communication to communicate with a system terminal 30. To use the power line to communicate with each of the monitoring and shutdown devices, the system terminal 30 uses a demodulator 40 to connect with the power series circuit. The demodulator 40 receives and demodulates the carrier waves modulated by the monitoring and shutdown devices and sent to the power series circuit, and then sends the demodulated carrier waves to the system terminal 30.

The connection between the system terminal 30 and the demodulator 40 can be wired or wireless. The demodulator 40 can further connect a current acquisition unit 50 and a power supply unit 60. The current acquisition unit 50 and the power series circuit are connected to detect a circuit current. The acquired information of the circuit current is transmitted by the demodulator 40 to the system terminal 30. The power supply unit 60 supplies the working power required by the demodulator 40.

According to the above-mentioned connections, the system terminal 30 and each of the monitoring and shutdown devices on the power series circuit form a master-slave architecture. That is, each of the monitoring and shutdown devices is a slave device that uses the control switch 11 thereof to collect the voltage and temperature information of the PV module 20. Through the power series circuit, the information is transmitted via PLC to the system terminal 30. The system terminal 30 is a master device. According to the voltage and temperature data transmitted from the monitoring and shutdown devices, the system terminal 30 determines whether the voltage or temperature is abnormal. When an abnormal condition occurs, a shutdown command is sent out via the power series circuit to shut down a specific PV module 20. There is no need to send a maintenance personnel to the site to manually shut down the specific PV module 20.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A monitoring and shutdown device for a solar photovoltaic (PV) module, comprising:
   a control switch (11);
   a micro control unit (10) having a plurality of input/output (I/O) terminals;
   a driver module (12) connected between one of the I/O terminals of the micro control unit (10) and the control switch (11);
   a voltage acquisition unit (13) having a set of input terminals and an output terminal, with the output terminal thereof connecting to one of the I/O terminals of the micro control unit (10);

a temperature acquisition unit (14) having a temperature output terminal connecting to one of the I/O terminals of the micro control unit (10); and a power line communication (PLC) module (15) having power line connection terminals and an information transmission terminal, with the information transmission terminal connecting to one of the I/O terminals of the micro control unit (10).

2. The monitoring and shutdown device for a solar PV module according to claim 1, wherein the control switch (11) has a positive output terminal and a negative output terminal;

the set of input terminals of the voltage acquisition unit (13) are connected to the positive output terminal and the negative output terminal of the control switch (11); and the power line connection terminals of the PLC module (15) is connected to the positive output terminal and the negative output terminal of the control switch (11).

3. The monitoring and shutdown device for a solar PV module according to claim 1, wherein the control switch (11) has a controlled terminal connected to the driver module (12).

4. The monitoring and shutdown device for a solar PV module according to claim 2, wherein the control switch (11) has a positive input terminal and a negative input terminal both being connected respectively to a positive output terminal and a negative output terminal of a respective PV module (20); and the PLC module (15) is connected via the respective PV module (20) with other PV modules (20) in series to form a power series circuit, and the power series circuit is connected with a demodulator (40) that is further connected to a system terminal (30).

5. The monitoring and shutdown device for a solar PV module according to claim 4, wherein the demodulator (40) is connected with a current acquisition unit (50) that is in connection with the power series circuit.

6. The monitoring and shutdown device for a solar PV module according to claim 1, wherein the micro control unit (10) is connected with a DC/DC conversion unit (16) that has a set of module power connection terminals and a power output terminal, with the power output terminal connected with the micro control unit (10).

7. The monitoring and shutdown device for a solar PV module according to claim 2, wherein the micro control unit (10) is connected with a DC/DC conversion unit (16) that has a set of module power connection terminals and a power output terminal, with the power output terminal connected with the micro control unit (10).

8. The monitoring and shutdown device for a solar PV module according to claim 3, wherein the micro control unit (10) is connected with a DC/DC conversion unit (16) that has a set of module power connection terminals and a power output terminal, with the power output terminal connected with the micro control unit (10).

9. The monitoring and shutdown device for a solar PV module according to claim 4, wherein the micro control unit (10) is connected with a DC/DC conversion unit (16) that has a set of module power connection terminals and a power output terminal, with the power output terminal connected with the micro control unit (10).

10. The monitoring and shutdown device for a solar PV module according to claim 5, wherein the micro control unit (10) is connected with a DC/DC conversion unit (16) that has a set of module power connection terminals and a power output terminal, with the power output terminal connected with the micro control unit (10).

* * * * *